US00RE39833E

(19) United States
(12) Reissued Patent
Mitchell et al.

(10) Patent Number: US RE39,833 E
(45) Date of Reissued Patent: Sep. 11, 2007

(54) THERMALLY ACTUATED SPECTROSCOPIC OPTICAL SWITCH

(75) Inventors: Joseph Nathan Mitchell, San Antonio, TX (US); Martin Peter Wuest, San Antonio, TX (US)

(73) Assignee: Southwest Research Institute, San Antonio, TX (US)

(21) Appl. No.: 11/151,715

(22) Filed: Jun. 13, 2005

Related U.S. Patent Documents

Reissue of:
(64) Patent No.: 6,587,612
Issued: Jul. 1, 2003
Appl. No.: 09/656,092
Filed: Sep. 6, 2000

(51) Int. Cl.
*G02B 6/35* (2006.01)
*G02B 26/08* (2006.01)

(52) U.S. Cl. ..... 385/18; 385/17; 385/19; 359/223; 359/224

(58) Field of Classification Search ..... 385/16–22; 359/290, 291, 223, 224, 813, 822
See application file for complete search history.

(56) References Cited

U.S. PATENT DOCUMENTS

| | | | | | |
|---|---|---|---|---|---|
| 4,948,223 | A | * | 8/1990 | Anderson et al. | 385/16 |
| 5,136,669 | A | * | 8/1992 | Gerdt | 385/39 |
| 5,446,811 | A | * | 8/1995 | Field et al. | 385/23 |
| 5,621,829 | A | * | 4/1997 | Ford | 385/22 |
| 5,903,380 | A | * | 5/1999 | Motamedi et al. | 359/224 |
| 5,920,665 | A | * | 7/1999 | Presby | 385/16 |
| 5,960,132 | A | * | 9/1999 | Lin | 385/18 |
| 5,998,906 | A | * | 12/1999 | Jerman et al. | 310/309 |
| 6,091,867 | A | * | 7/2000 | Young et al. | 385/17 |
| 6,259,835 | B1 | * | 7/2001 | Jing | 385/18 |
| 6,275,325 | B1 | * | 8/2001 | Sinclair | 359/291 |
| 6,360,036 | B1 | * | 3/2002 | Couillard | 385/19 |
| 6,366,414 | B1 | * | 4/2002 | Aksyuk et al. | 359/822 |
| 6,438,954 | B1 | * | 8/2002 | Goetz et al. | 60/527 |
| 6,449,406 | B1 | * | 9/2002 | Fan et al. | 385/17 |
| 2002/0106834 | A1 | * | 8/2002 | Chiu et al. | 438/113 |

* cited by examiner

*Primary Examiner*—John D. Lee
(74) *Attorney, Agent, or Firm*—Baker Botts LLP

(57) ABSTRACT

A thermally actuated spectroscopic optical switch including reflective surfaces which are selectively moved into a position intersecting a beam of light by applying electrical or heat energy to a selected composite cantilever beam on which the reflective surface is mounted.

22 Claims, 2 Drawing Sheets

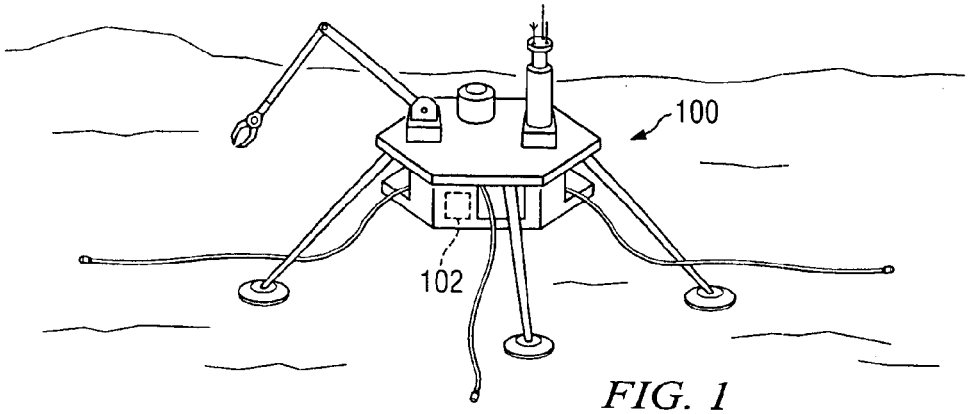
FIG. 1
(amended)

THERMALLY ACTUATED SPECTROSCOPIC OPTICAL SWITCH

Matter enclosed in heavy brackets [ ] appears in the original patent but forms no part of this reissue specification; matter printed in italics indicates the additions made by reissue.

FIELD

The present invention generally relates to the switching of light beams carried by different fiber optic cables to a single light beam receptor; more particularly, the present invention relates to an optical switch that is suitable for use in spectroscopic applications.

BACKGROUND

The use of optical methods for testing, measuring, and system operations has become increasingly important. Optical methods are especially important for use in monitoring system operations, particularly when the monitoring of system operations is conducted by means such as absorption, emission, reflectance, fluorescence, or Raman spectroscopy. All of these monitoring methods require that a light beam be guided, usually by an optical fiber, to a detection device or a receptor, which, in many cases, is a spectrograph. In monitoring situations which include the simultaneous analysis of multiple samples or the analysis of points that are spatially separated, either multiple detectors, multiple receptors, or the imaging of multiple inputs on a single detector or receptor is required.

It has been found that prior art approaches for imaging multiple inputs on a single detection device or a single receptor are not always feasible. For example, if one wants to image a two-dimensional area of a sample, as is done in confocal Raman spectroscopy, typically there is only sufficient imaging space available on the detection device for one image. Hence, in order to obtain two-dimensional images from several samples, the light input source must be switched to enable use of a single spectrograph.

The potential applications for a spectroscopic grade fiber optical switch are many. For example, a single spectrograph could be shared among several investigations, reducing the expense associated with duplicating equipment, and conserving precious rack space.

In yet another potential application, a spectroscopic grade fiber optical switch could be used on a planetary lander 100 (FIG. 1) to switch input channels. For example, a single spectrograph could receive inputs from fiber optic probes on the robot arm, fiber optic probes in the bore of a drilled hole, fiber optic probes on lander legs, or fiber optic probes 102 harpooned away from the planetary lander as shown in FIG. 1.

In yet still another potential application (e.g., Raman spectroscopy), the problem exists that inorganic minerals are better analyzed using an incident wavelength in the visible range (e.g., 532 nm), while organic materials are better analyzed in the near infrared wavelength range (e.g., 1064 nm). A fiber optic switch could be used to switch laser light beams to a single, dual wavelength, imaging spectrograph.

Prior art devices exist for routing optical signals, but these prior art devices have many limitations. One prior art method uses a mechanical fiber switch that relies on motors to physically align several optical fibers. These prior art active optical switching methods tend to be slow, bulky, and expensive. Additionally, these prior art active optical switching methods are not suitable for applications in space travel since the moving parts may cold-weld together, thereby disabling the optical switching mechanism.

Another prior art active method for routing optical signals is electro-optical switching. The devices using electro-optical switching have no moving components and provide their switching action by the application of a voltage that produces a phase-shift in a waveguide to redirect the light beam. The electro-optical switching method is fast, but has a wavelength range which is limited to only a few nanometers.

Several prior art passive optical "switching" methods are available. One example of a prior art passive switching method is a polarizing splitter. Polarizing splitters can only redirect a light beam having a specific polarization. However, the use of polarizing splitters results in the loss of information that may be contained in the polarization state of the light. Additionally, using only polarized light results in a 50% loss in intensity.

Another prior art passive switch method is a fused splitter. Fused splitters can also be used to split or combine optical signals between multiple fibers. Specifically, fused splitters are constructed by fusing and tapering two optical fibers together. Fusing and tapering two optical fibers together provides a simple, rugged, and compact method of splitting and combining optical signals. Typical excess losses in fused splitters are low, while splitting ratios are accurate to within ±5 percent at the design wavelength. Fused splitters are bidirectional and offer low backreflection. However, fused splitters suffer from some disadvantages. Specifically, signal intensity in fused splitters is split between the outputs. This splitting between the outputs results in high loss for larger port counts.

Still another type of prior art passive switching method is a multi-mode fused splitter. Multi-mode fused splitters have a somewhat limited spectral range and are mode dependent. Certain modes within one fiber in multi-mode fused splitters are transferred to the second fiber, while other modes are not. As a result, the splitting ratio in multi-mode fused splitters will depend on what modes are excited within the fiber. In comparison, single mode fused splitters only transmit one mode. Accordingly, single mode fused splitters do not suffer from mode dependency. However, single mode fused splitters are even more highly wavelength-dependent. A difference in wavelength of only 10 nm can cause a significant change in the splitting ratio.

Except for some mechanical active optical switching methods which use motors, no prior art switching technique can achieve the broad wavelength range and the low signal loss required for spectroscopic measurement (e.g., Raman spectroscopy applications.) However, optical switching methods that use motors or gears to mechanically align fibers are prone to problems in space (e.g., cold welding, stiction). Therefore, to achieve the full potential of distributed multi-spectral optical sensing, a small, inexpensive, broadband, reliable, fast, and low-loss optical switch is required.

Accordingly, there remains a need in the art for an optical switch suitable for use in fiber-optic spectroscopy which is small, inexpensive, reliable, has no moving parts (causing friction and possible cold-welding in space applications), and is able to cover a large wavelength range.

SUMMARY

The thermally actuated spectroscopic optical switch of the present invention is small, inexpensive, reliable, has no moving parts, and is able to cover a large range of wavelengths. The design of the thermally actuated spectroscopic optical switch of the present invention has a number of advantages over other types of switches. Being a MEMS-based (MicroElectroMechanical Systems) device, the disclosed thermally actuated spectroscopic optical switch benefits from all the advantages of small size and batch fabrication. The disclosed thermally actuated spectroscopic optical switch includes an array of optical fibers and an array of movable reflective surfaces which are actuated by applying energy to the thermal actuator on which the reflective surface is mounted. The actuators do not have any physical contact with the surface (substrate) near the reflector. This absence of physical contact with the reflector eliminates stiction, wear, and cold welding problems.

The amount of deflection in thermal actuators and hence, the position of the reflector can be fully controlled since the amount of deflection is proportional to the applied current. Thermally actuated spectroscopic optical switches built according to the present invention have actuation speeds of about 100 msec or less.

The present invention also includes a method of spectroscopic switching utilizing a micromachined actuator that can select an input probe or switch between different wavelength sources.

BRIEF DESCRIPTION OF THE DRAWINGS

A more complete understanding of the structure and operation of the thermally activated spectroscopic optical switch of the present invention may be had by reference to the following detailed description when taken in conjunction with the accompanying drawings, wherein:

FIG. 1 is a perspective view in a lander which includes a single spectrograph addressed by different input fibers;

DESCRIPTION OF THE EMBODIMENTS

General

As shown in FIGS. 3, 4A, 4B, 5A and 5B, the thermally actuated spectroscopic optical switch 10, 110, 210 of the present invention is a MEMS-based device. A variety of schemes have been employed to actuate prior art MEMS-based devices. These prior art schemes include electrostatic, thermal (both bimorph and phase changing), electromagnetic, piezoelectric, and hydraulic actuators. Electrostatic devices are the most common MEMS devices, as they are versatile, simple to employ, energy efficient, and fully compatible with IC fabrication processes. However, electrostatic forces employed in electrostatic MEMS devices have a limited range and are non-linear. The displacement of an actuator in an electrostatic MEMS device can only be controlled over a small range, at which point the electrostatic MEMS device reaches an instability point known as the pull-in voltage. At the pull-in voltage, the actuator fully deflects to the opposite electrode. In space-based applications, deflecting to the opposite electrode is not suitable since full deflection to the opposite electrode creates a physical contact point, thus triggering the potential for cold welding.

A variety of actuation methods have been utilized for prior art optical switching using micromachined devices. Comb-drives have been used to make a 2×2 switch with bare fibers. Scratch drives have been used for 2×2 switching. Scratch drives have also been used as actuators for an array of fold-up mirrors. Also proposed was an arrayed switch using torsion mirrors. A 1×8 switch has been made using micromotors.

Figure 2A:
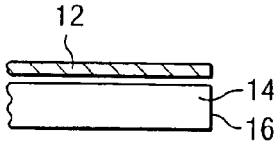
FIGS. 2A and 2B are schematic diagrams illustrating the heating of a bimorph composite beam which causes one material to expand more than the other material, which results in the bending of the bimorph composite beam.
Figure 2B:
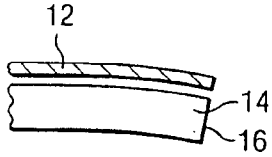

Bimorph thermal actuators provide a more suitable actuation method since their deflection is a linear function of the change in material temperature. As shown in FIG. 2A and FIG. 2B, two materials having differing thermal expansion coefficients, such as aluminum 12 and silicon 14, are bonded together to form bimorph thermal actuators. When heated, the aluminum 12 expands more than the silicon 14. This difference in bending causes a composite beam made from these two materials to bend as shown in FIG. 2B. The bending of the composite beam produces a deflection of the tip 16 of the beam.

Heating of the composite beam can be accomplished by using the conductive layers as resistive heaters. By applying a specific current to the heated part of the composite beam, a certain amount of deflection can be achieved.

Figure 3:
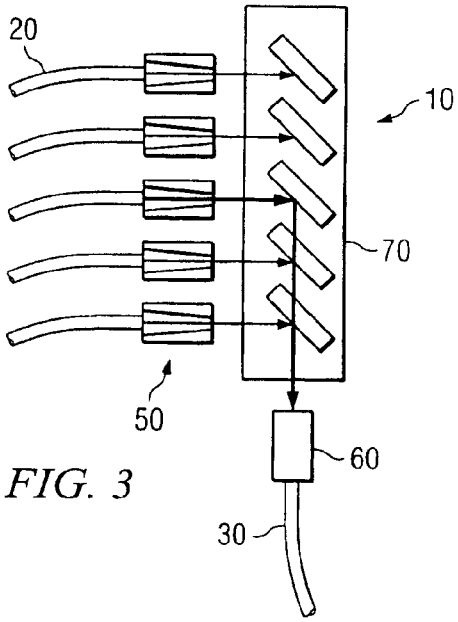
FIG. 3 is a top plan view a spectrometer optical switch with five inputs and one output.
Figure 4A:
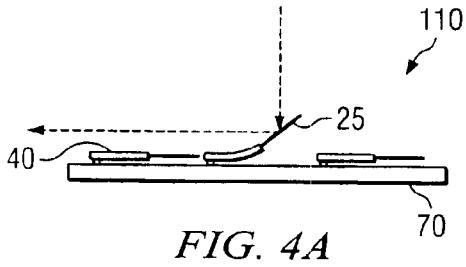
FIGS. 4A and 4B are a side elevational view and a top plan view, respectively, of a first embodiment (horizontal mirror) of a thermally actuated spectroscopic optical switch.
Figure 4B:
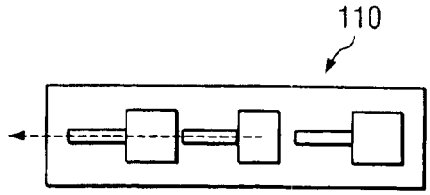
Figure 5A:
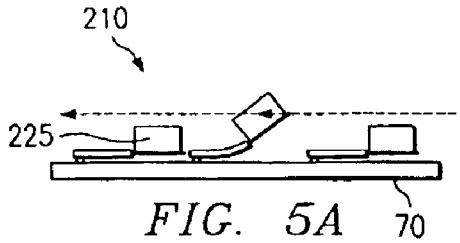
FIGS. 5A and 5B are a side elevational view and a top plan view, respectively, of a second embodiment (vertical mirror) of a thermally actuated spectroscopic optical switch.
Figure 5B:
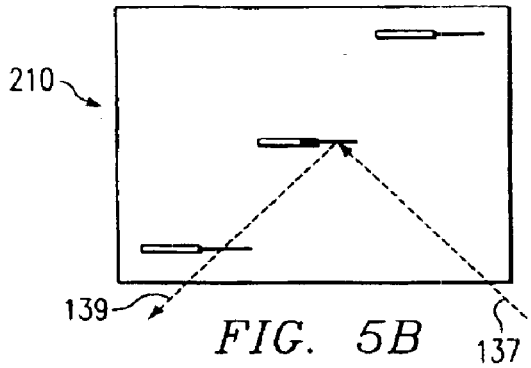

When a composite beam is attached to a mirror, the bending of the composite beam can either angularly orient the mirror (in the horizontal design shown in FIGS. 4A and 4B) or move the mirrors up and down, in or out of the beampath (in the vertical design shown in FIGS. 3, 5A and 5B). These composite beam based devices tend to require moderate power to operate. Specifically, the power requirements are on the order of one-hundred milliwatts. Thermal bimorph actuators have been used in a variety of experiments including scanning and micromanipulation.

Thermally actuated bimorphs have also been investigated for applications in fluidic valves and optical scanning. A thermally actuated cantilever beam has been used for gripping against a substrate, as a micro-tweezer. Optical scanning has been accomplished using a multilayer actuator with a reflective tip. In yet another application, a horizontal thermal cantilever has been made using a single material to drive a micromoter. However, thermally actuated cantilever beams have not found utilization in optical switches.

MEMS micromirrors have been utilized in a variety of applications, most notably in a commercial DLP projection system manufactured by Texas Instruments. The micromachined surfaces of MEMS mirrors exhibit little scattering since they are nearly atomically smooth. With a metallic coating, such as aluminum or gold, MEMS micromirrors can achieve a reflectivity of greater than 95% over a broad wavelength range.

Unlike the present invention, it has been found that all of the electrostatic MEMS devices make contact with the substrate as the actuator travels or slides along the surface of the substrate. It has also been found that such thermal actuators are either limited to a single direction of actuation, manipulate objects that slide along the surface of the substrate, or simply were not used for switching between optical fibers. Also, no thermal actuators used with MEMS devices have been designed for use other than in room temperature environments.

Preferred Embodiment

As shown in FIG. 3, FIG. 4A and FIG. 4B, the thermally actuated optical switch of the present invention may include an array of input fibers 20 and output fibers 30 together with an array of thermally actuated cantilever beams 40 which provide the switching action. Collimating lenses 50 are located at the end of the input fibers 20, while collector lenses 60 are put in front of the output fibers 30.

The thermally actuated spectroscopic optical switch 10 of the present invention comprises a single chip linear array of micro mirrors 25 positioned on a thermally actuated beam 40. The thermally actuated beam 40, shown in FIG. 4A and FIG. 4B, is a multi-layer cantilever structure with a mirror 25 positioned at the tip 16. For example, the beam shown in FIG. 4A and FIG. 4B may be a silicon beam sandwiched between two materials having different coefficients of thermal expansion. On top of the two thermal expansion materials, a conductive layer may be coated.

Figure 8:
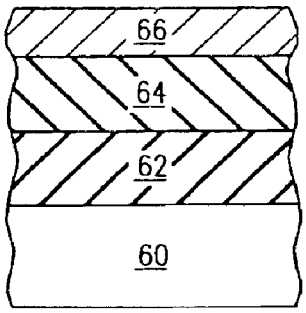
FIG. 8 is a cross-section of a cantilever thermal actuator.

In its simplest version, and as shown in FIG. 8, the cantilever actuator has four layers. These four layers include a silicon wafer substrate 60; a sacrificial oxide layer 62 which is removed to release the device; an insulating structural layer 64 with a first thermal expansion coefficient; and a conducting layer 66 with a second thermal expansion coefficient, such as a metal layer.

As shown in FIGS. 3, 4 and 4A, a chip 70 with an array of mirrors 25 will have multiple fibers placed around it. For example, as shown in FIG. 3, one of multiple input fibers 20 can be connected to a single output fiber 30. Alternatively, multiple output fibers 20 can connect to a single input fiber 30.

The thermal cantilever actuator 40 used in the present invention has a number of advantages over other types of actuators. Specifically, the thermal cantilever actuator 40 has no friction since it makes no physical contact with any surface. Likewise, the thermal cantilever actuator 40 will not be prone to any stiction or surface bonding that may occur in cold environments. The deflection of the thermal cantilever actuator 40 is fully controllable, unlike electrostatic actuators, since electrostatic actuators have only a small stable range before reaching their pull-in voltage. The thermal cantilever actuator 40 tends to be moderately fast operating, with an actuation speed on the order of 10–100 msec. In addition, a large deflection can be achieved. Specifically, it has been found that deflections on the order of 20% of the cantilever length can be obtained. Such large deflections correspond to an optical reflection angle of <20°.

The typical power consumption of a thermal cantilever actuator such as the one described herein is on the order of ten to one-hundred milliwatts. Finally, the thermal cantilever actuator 40 has no moving parts that can generate wear or breakage. Since the thermal cantilever actuator 40 can be formed using micromachining techniques, the use of a thermal cantilever actuator 40 obtains all the advantages of very compact size and the repeatability of fabrication needed to produce an operative array of movable mirrors for reflecting a beam of light.

In the horizontal mirror system 110 shown in FIGS. 4A and 4B, the light is incident at an angle to the chip face 70 and the mirrors 25 are raised to an angle that intersects and deflects the light beam to the output fiber 30 shown in FIG. 3. This embodiment allows the mirrors 25 to be fabricated substantially parallel to the plane of the wafer 70. Fabricating the mirrors 25 in the plane of the wafer 70 eliminates any need for assembly since the resulting device is monolithic. Additionally, a very small actuator motion can achieve the desired deflection of the light beam without blocking other optical paths near the wafer.

Alternate Embodiments

The second embodiment 210 shown in FIGS. 5A and FIG. 5B involves mirrors 225 that are mounted vertical to the plane of the wafer 70 and placed at a 45° angle to the incident optical beams 137. In this embodiment both the incident 137 and reflected 139 light beams run parallel to the plane 170 of the wafer 135. Running the incident 137 and reflected 139 light beams parallel to the plane of the wafer 70 simplifies the fiber placement since the fibers can be directly attached to the wafer 70 and aligned using integrated alignment grooves. This second embodiment 210 also allows for greater scalability since any input can be redirected to other outputs by adding additional rows of mirrors 225.

The horizontal mirror embodiment shown in FIGS. 4A and FIG. 4B is limited to multiple inputs and a single output, or multiple outputs and a single input, but the embodiment shown in FIGS. 5A and FIG. 5B can be expanded to multiple inputs and multiple outputs, limited only by the wafer size.

Since the thermally actuated spectroscopic optical switch of the present invention must operate in a wide range of thermal environments, it has been designed so as to minimize its response to changes in ambient temperature. Minimization of response to changes in ambient temperature can be accomplished for both embodiments 110, 210 by creating a thermally balanced actuator.

Figure 6A:
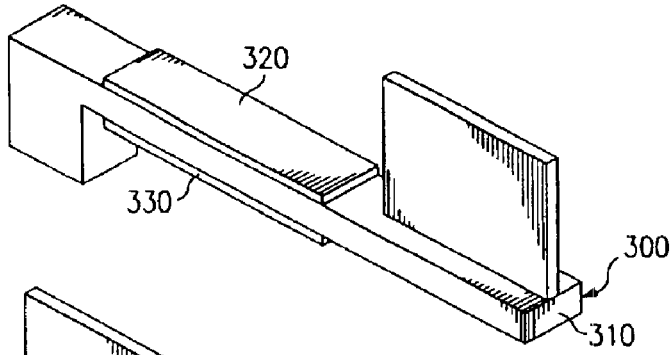
FIG. 6A is a perspective view of an alternative embodiment of a multi-layer balanced thermal actuator wherein an insulating material separates the upper and lower metal current path layers together with a vertical mirror mounted on the end of a cantilever beam.
Figure 6B:
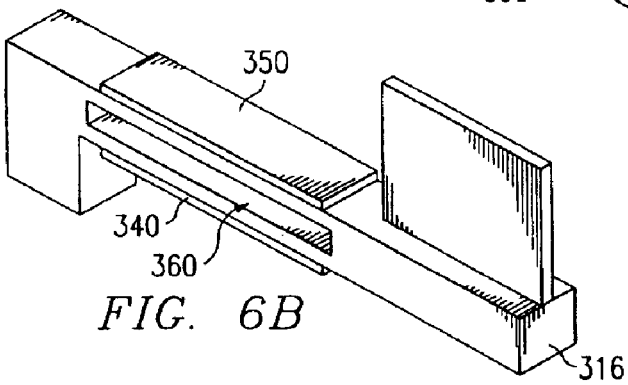
FIG. 6B is a perspective view of an alternative embodiment of a multi-layer balanced thermal actuator wherein the separation is by an air or vacuum gap together with a vertical mirror mounted on the end of the cantilever beam.

As shown in FIG. 6A, a thermally balanced actuator 300 is a multi-layer structure that can be used with the middle layer 310 comprising an insulating dielectric structural material such as single crystal silicon, silicon dioxide, or silicon nitride located between (e.g., sandwiched between or attached to) two conducting layers 320 and 330. Alternatively, as shown in FIG. 6B, two individual bimorphs 340, 350 can be created, connected at the tip 316, and separated by an air gap 360. Each bimorph actuates in an opposite direction, such that both of the structures shown in FIGS. 6A and FIG. 6B may be actuated in either direction. Being able to actuate in either direction results in faster actuation speeds since cooling is a slower process than heating. A thermally balanced actuator also reduces problems due to residual stresses in the film layers that produce the initial curvatures in released multi-layer structures.

Figure 7:
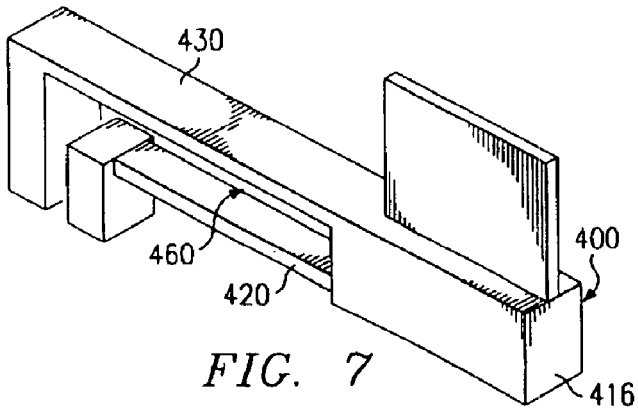
FIG. 7 is a perspective view of a thermal actuator where the hot arm is positioned below the cold arm so that the thermal actuator will deflect upward when powered.

The embodiment 400 shown in FIG. 7 does not use a bimorph approach. Rather, this embodiment includes a narrow arm 420 and a wide arm 430. Both arms 420, 430 can be made of the same material, arranged one above the other with a gap 460 between them and joined at the free end 416. When current or electrical energy flows through the narrow arm 420, the higher current density in the narrow arm 420 causes it to heat and expand more than in the wider "cold" arm 430, with a resultant bending motion.

Additional optical elements must be added to the thermally actuated optical switch of the present invention to prevent large losses. The light beam output of a fiber diverges rapidly, so, as shown in FIG. 3, in the preferred embodiment, small microlenses 50, 60 have been placed in front of the fiber ends to collimate the light beam. Fiber coupled versions of both ball lenses and gradient index lenses are available for use that can produce collimated beams of only a few hundred microns diameter over a distance of several centimeters.

The behavior of a simple bimorph actuator as shown in FIGS. 6A and 6B can be explained fairly well in terms of composite beam theory. A current path is formed through the bimorph actuator such that a portion of the path will be highly resistive, creating localized heating. The increase in temperature causes the composite beam to expand. Since the two materials have different thermal expansion coefficients, they expand at different rates. This causes the composite beam to bend in the direction of the material with the lower coefficient of thermal expansion. For example, if an insulating layer were placed atop a metal layer, heating the composite beam would cause it to bend upward. The upward bending may then be used to deflect a mirror that is fabricated at the tip of the composite cantilever beam. The selective deflection of the mirror into a light beam causes reflection of the selected light beam.

Although the invention has been described with reference to specific embodiments, this description is not meant to be construed in a limited sense. Various modifications of the disclosed embodiments, as well as alternative embodiments of the inventions, will become apparent to persons skilled in the art upon the reference to the description of the invention. It is, therefore, contemplated that the appended claims will cover such modifications that fall within the scope of the invention.

What is claimed is:

1. A system for directing a selected light beam to at least one light beam receptor, said system comprising:

an array of stationary optical fibers, each one of said stationary optical fibers constructed and arranged to conduct one of a plurality of light beams including the selected light beam;

an optical switch fabricated on a substrate, the switch having an array of movable reflective surfaces, and having a single thermal actuator associated with each reflective surface, each thermal actuator comprising a cantilevered arm having a fixed end attached to the substrate and a free end to which the reflective surface is attached, the arm being made from a material having a thermal expansion property, the arm having a top surface and a bottom surface with a layer of material having a different thermal expansion property on a portion of at least one of these surfaces, and the cantilevered arm having an air gap between its top and bottom surfaces;

a lens at the end of each optical fiber, operable to direct the light beams to the switch or to collect light from the switch;

wherein each reflective surface is attached such that it is substantially perpendicular to the substrate; and wherein the optical fibers are arranged around the perimeter of the substrate, such that each reflective surface is moveable into the path of one or more of the optical fibers.

2. The system of claim 1, wherein each cantilevered arm is made from a material selected from the group of single crystal silicon, polycrystalline silicon, silicon dioxide, or silicon nitride.

3. The system of claim 1, wherein the arm has a layer on each of the top and bottom surfaces and these layers have the same thermal expansion property.

4. The system of claim 1, wherein the arm has a layer on each of the top and bottom surfaces and these layers have different thermal expansion properties.

5. The system of claim 1, wherein the layers are made from a metallic material.

6. The system of claim 1, wherein each cantilevered arm is spaced from the substrate by means of an extension of the arm extending substantially vertically from the substrate.

7. The system of claim 1, wherein the application of electrical or heat energy to one of said thermal actuators will move said reflective surface into the path of the selected light beam so that the selected light beam will be directed to the light beam receptor.

8. The system of claim 1, wherein the reflective surface is rigidly attached to the arm.

9. A thermally operated optical switch for use in directing a beam of light to at least one receptor, said thermally operated optical switch comprising:

a substrate;

an array of reflective surfaces; and a plurality of cantilever thermal actuators, each cantilever actuator having a fixed end affixed to the substrate and having a free end to which an associated reflective surface is attached such that each reflective surface has a single associated actuator, and wherein each actuator has a cantilevered arm made from a material having first thermal expansion property, each arm having an upper surface and a lower surface and having a layer of material having a second thermal expansion property on a portion of both of these surfaces;

wherein each reflective surface is attached such that it is substantially perpendicular to the substrate.

10. The thermally operated optical switch of claim 9 wherein cantilevered arm has an air gap between its top and bottom surfaces.

11. The thermally operated optical switch of claim 9 wherein each cantilevered arm is made from a material selected from the group of single crystal silicon, polycrystalline silicon dioxide, or silicon nitride.

12. The thermally operated optical switch of claim 9 wherein the arm has a layer on each of the top and bottom surfaces and the layers have the same thermal expansion property.

13. The thermally operated optical switch of claim 9, wherein the arm has a layer on each of the top and bottom surfaces and the layers have different thermal expansion properties.

14. The thermally operated optical switch of claim 9 wherein the layers are made from a metallic material.

15. The system of claim 9, wherein the application of electrical or heat energy to one of said thermal actuators will move said reflective surface into the path of the selected light beam so that the selected light beam will be directed to the light beam receptor.

16. The system of claim 9, wherein the reflective surface is rigidly attached to the arm.

17. A thermally operated optical switch for use in directing a beam of light to at least one receptor, said thermally operated optical switch comprising:

a substrate;

an array of reflective surfaces; and a plurality of cantilever actuators, each actuator having a pair of arms, each arm of the pair having a fixed end affixed to the substrate, and the arms of each pair having a common free end to which an associated reflective surface is rigidly attached, such that each reflective surface has a single associated actuator;

wherein each reflective surface is attached such that it is parallel to the substrate.

18. The switch of claim 17, wherein the arms of each pair have different widths.

19. The switch of claim 17, wherein the arms of each pair have different lengths, such that one arm of each pair is located under the other arm of that pair.

20. The switch of claim 17, wherein each cantilevered arm is made from a material selected from the group of single crystal silicon, polycrystalline silicon, silicon dioxide, or silicon nitride.

21. The switch of claim 17, wherein each cantilevered arm is spaced from the substrate by means of an extension of the arm extending substantially vertically from the substrate.

22. The switch of claim 17, wherein the arms of each pair have different thermal expansion properties.

* * * * *